United States Patent
Kimoto

(10) Patent No.: US 12,347,741 B2
(45) Date of Patent: Jul. 1, 2025

(54) SEMICONDUCTOR DEVICE COMPRISING A RESIN MEMBER HAVING A RIB INCLUDING A LOWER END LOCATED BELOW LOWER ENDS OF A PLURALITY OF PIN FINS AND SEMICONDUCTOR DEVICE MANUFACTURING METHOD

(71) Applicant: Mitsubishi Electric Corporation, Tokyo (JP)

(72) Inventor: Nobuyoshi Kimoto, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 475 days.

(21) Appl. No.: 17/755,916

(22) PCT Filed: Jan. 8, 2020

(86) PCT No.: PCT/JP2020/000274
§ 371 (c)(1),
(2) Date: May 11, 2022

(87) PCT Pub. No.: WO2021/140586
PCT Pub. Date: Jul. 15, 2021

(65) Prior Publication Data
US 2022/0392822 A1 Dec. 8, 2022

(51) Int. Cl.
*H01L 23/367* (2006.01)
*H01L 21/56* (2006.01)
*H01L 23/29* (2006.01)

(52) U.S. Cl.
CPC ........ *H01L 23/3677* (2013.01); *H01L 21/565* (2013.01); *H01L 23/293* (2013.01)

(58) Field of Classification Search
CPC ........... H01L 23/3677; H01L 23/49562; H01L 23/49575; H01L 24/29; H01L 24/40;
(Continued)

(56) References Cited

U.S. PATENT DOCUMENTS

2013/0154081 A1* 6/2013 Kadoguchi ............ H01L 24/37
257/712
2015/0021750 A1 1/2015 Fujino et al.
(Continued)

FOREIGN PATENT DOCUMENTS

CN 107924885 A 4/2018
DE 11 2013 001 612 T5 1/2015
(Continued)

OTHER PUBLICATIONS

International Search Report issued in PCT/JP2020/000274; mailed Mar. 24, 2020.
(Continued)

*Primary Examiner* — Mamadou L Diallo
(74) *Attorney, Agent, or Firm* — Studebaker Brackett PLLC

(57) ABSTRACT

It is an object to provide technology enabling suppression of contact deformation of pin fins during assembly of a semiconductor device and the like. A semiconductor device includes a base plate, a semiconductor element, and a resin member. The base plate has a plurality of pin fins on a lower surface thereof. The semiconductor element is mounted on an upper side of the base plate. The resin member covers at least a side surface of the semiconductor element. The resin member has a rib covering a side surface of the base plate, and a lower end of the rib is located below lower ends of the plurality of pin fins.

18 Claims, 18 Drawing Sheets

(58) Field of Classification Search
CPC ............... H01L 24/83; H01L 24/84; H01L 2224/40137; H01L 21/565
See application file for complete search history.

(56) References Cited

U.S. PATENT DOCUMENTS

| | | | |
|---|---|---|---|
| 2016/0079155 A1* | 3/2016 | Kawase | H01L 25/072 257/712 |
| 2016/0190038 A1* | 6/2016 | Koyama | H05K 7/20927 165/80.4 |
| 2016/0322278 A1* | 11/2016 | Sawagashira | H01L 23/473 |
| 2017/0309540 A1 | 10/2017 | Temmei et al. | |
| 2018/0254235 A1* | 9/2018 | Tsuyuno | H01L 23/3121 |
| 2018/0261520 A1* | 9/2018 | Yamamoto | H01L 21/565 |
| 2020/0227333 A1* | 7/2020 | Tsuyuno | H01L 23/4334 |

FOREIGN PATENT DOCUMENTS

| | | |
|---|---|---|
| DE | 11 2015 004 424 B4 | 5/2021 |
| DE | 11 2013 007 047 B4 | 2/2023 |
| JP | H10-112519 A | 4/1998 |
| JP | 2012-044828 A | 3/2012 |
| JP | 2012-164763 A | 8/2012 |
| JP | 2013-012663 A | 1/2013 |
| JP | 2018-063999 A | 4/2018 |
| WO | 2016/067930 A1 | 5/2016 |

OTHER PUBLICATIONS

An Office Action mailed by the Chinese Patent Office on Apr. 26, 2024, which corresponds to Chinese Patent Application No. 202080091658.1 and is related to U.S. Appl. No. 17/755,916.

An Office Action issued by the German Patent and Trademark Office on Jun. 17, 2024, which corresponds to German Patent Application No. 112020006455.7 and is related to U.S. Appl. No. 17/755,916; with English language translation.

An Office Action; "Notice of Reasons for Refusal," mailed by the Japanese Patent Office on Sep. 6, 2022, which corresponds to Japanese Patent Application No. 2021-569645 and is related to U.S. Appl. No. 17/755,916; with English language translation.

* cited by examiner

F I G. 1
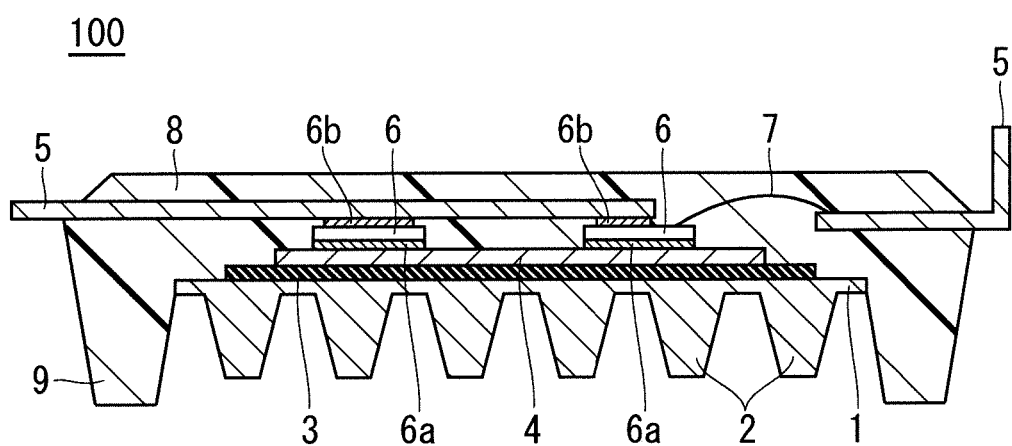

F I G. 4
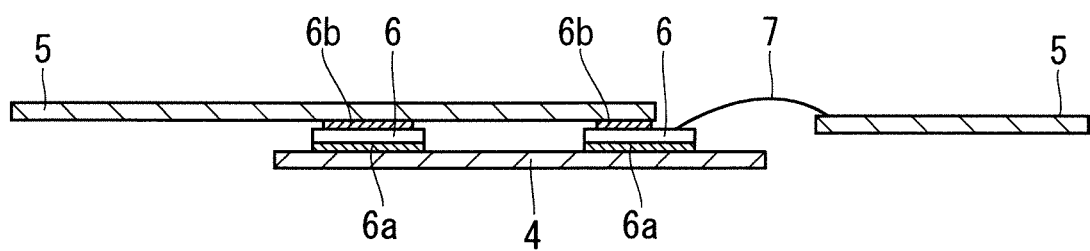

F I G. 5
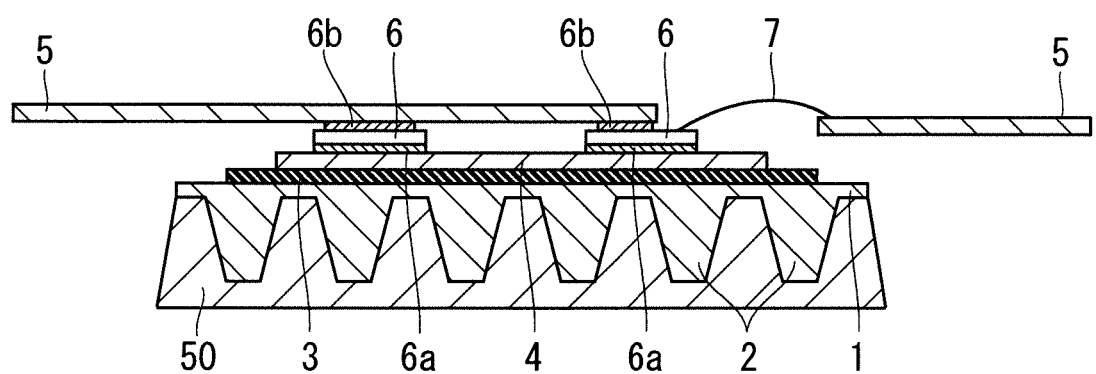

F I G. 1 0
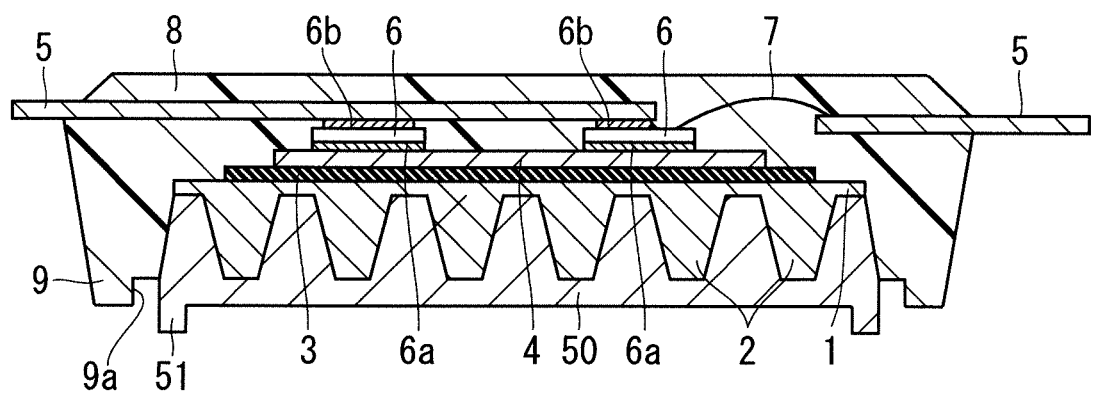

F I G. 1 6
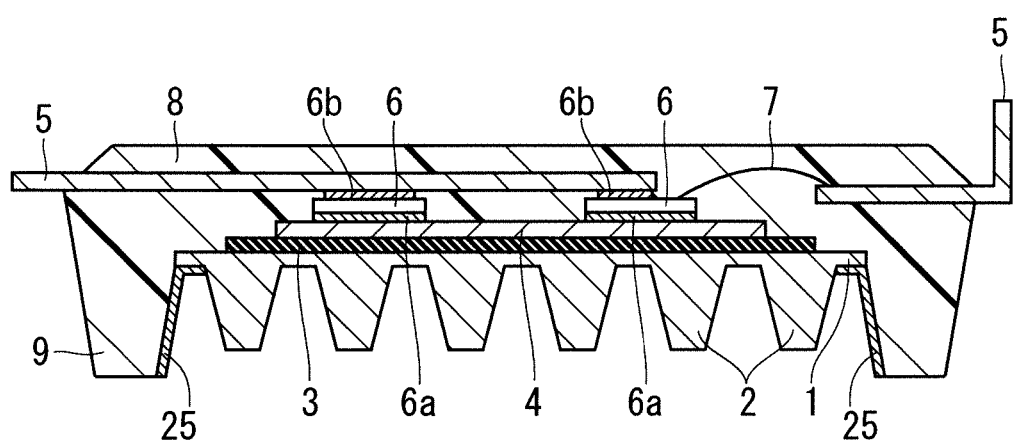

F I G. 1 7
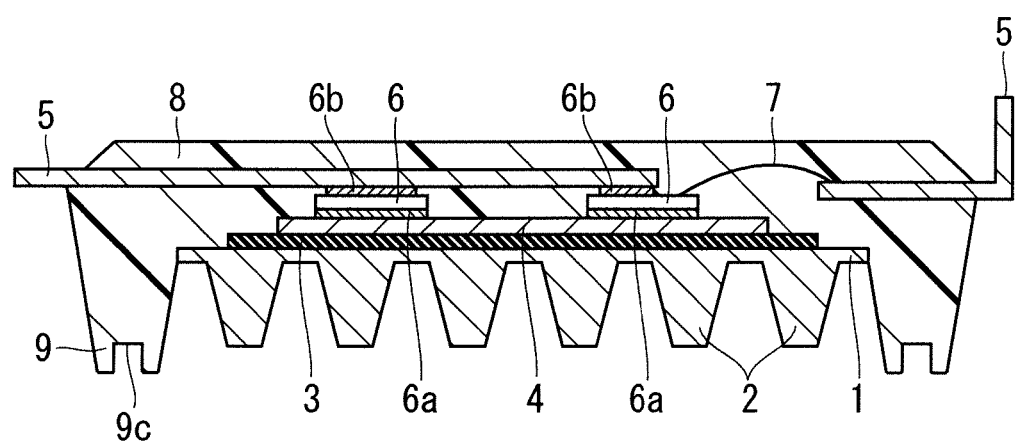

F I G. 1 8
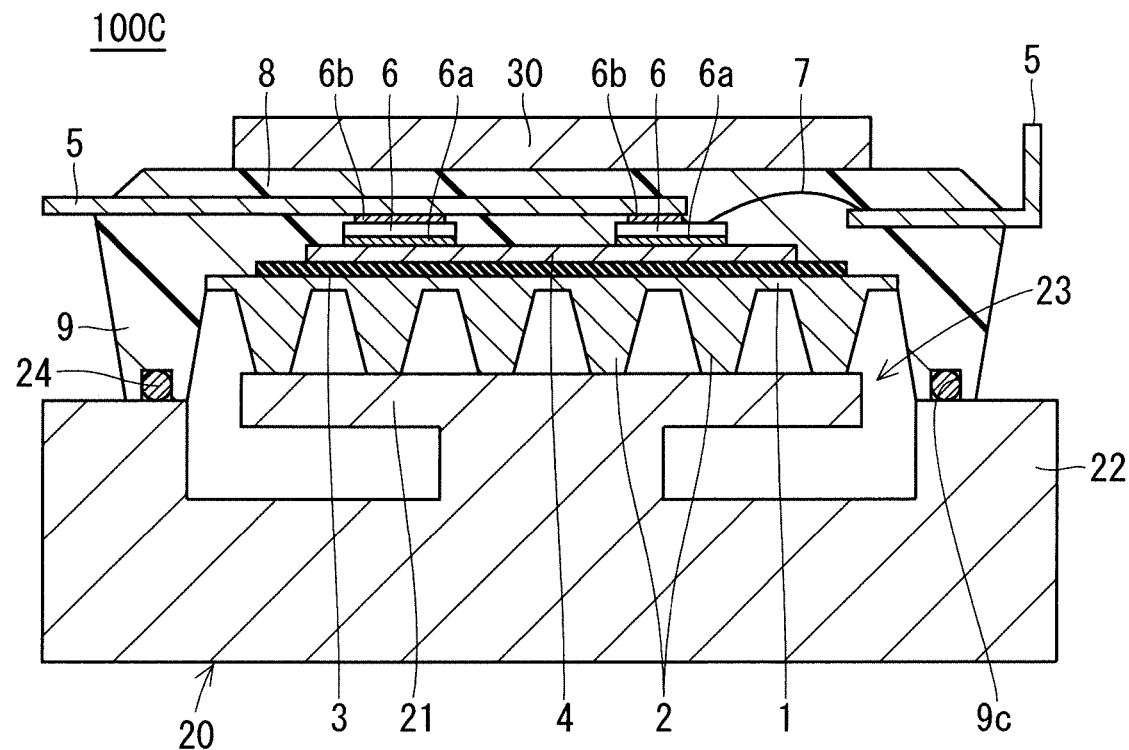

SEMICONDUCTOR DEVICE COMPRISING A RESIN MEMBER HAVING A RIB INCLUDING A LOWER END LOCATED BELOW LOWER ENDS OF A PLURALITY OF PIN FINS AND SEMICONDUCTOR DEVICE MANUFACTURING METHOD

TECHNICAL FIELD

The present disclosure relates to semiconductor devices and semiconductor device manufacturing methods.

BACKGROUND ART

A semiconductor device controlling power sometimes includes a base plate having pin fins for heat dissipation. The pin fins protrude downward from a package, so that the semiconductor device has a problem in that a worker can bring the pin fins into contact with a workbench by mistake and deform the pin fins during assembly of the semiconductor device and the like.

The pin fins are made of aluminum, and are thus particularly likely to be deformed by contact. Deformation of the pin fins can lead to reduction in heat dissipation, clogging of a refrigerant flow path, leakage of a refrigerant, and the like, so that a semiconductor device in which any of the pin fins is deformed cannot be shipped as a product due to malformation.

For example, Patent Document 1 discloses that, in a semiconductor device in which a cooler and a plurality of semiconductor modules to be cooled are integrated, a plurality of fins of the plurality of semiconductor modules are housed in a body of the cooler to be protected by the body of the cooler.

PRIOR ART DOCUMENT

Patent Document

Patent Document 1: Japanese Patent Application Laid-Open No. 2018-63999

SUMMARY

Problem to be Solved by the Invention

Technology disclosed in Patent Document 1, however, cannot solve the problem in that the worker can bring the plurality of fins into contact with the workbench by mistake and deform the plurality of fins, because the plurality of fins of the semiconductor modules protrude downward from an overmold before assembly to the cooler.

It is thus an object of the present disclosure to provide technology enabling suppression of contact deformation of pin fins during assembly of a semiconductor device and the like.

Means to Solve the Problem

A semiconductor device according to the present disclosure includes: a base plate having a plurality of pin fins on a lower surface thereof; a semiconductor element mounted on an upper side of the base plate; and a resin member covering at least a side surface of the semiconductor element, wherein the resin member has a rib covering a side surface of the base plate, and a lower end of the rib is located below lower ends of the plurality of pin fins.

Effects of the Invention

According to the present disclosure, the plurality of pin fins do not protrude downward from the rib, and thus contact deformation of the pin fins can be suppressed during assembly of the semiconductor device and the like.

The objects, features, aspects, and advantages of the present disclosure will become more apparent from the following detailed description and the accompanying drawings.

BRIEF DESCRIPTION OF DRAWINGS

FIG. 1 is a cross-sectional view of a semiconductor device according to Embodiment 1.

FIG. 4 is a cross-sectional view illustrating a wire bonding step.

FIG. 5 is a cross-sectional view illustrating a lower jig fitting step.

FIG. 10 is a cross-sectional view illustrating the resin molding step according to Modification 2 of Embodiment 1.

FIG. 16 is a cross-sectional view of a semiconductor device according to Embodiment 4 before assembly of the refrigerant jacket.

FIG. 17 is a cross-sectional view of a semiconductor device according to Embodiment 5 before assembly of the refrigerant jacket.

FIG. 18 is a cross-sectional view of the semiconductor device according to Embodiment 5.

DESCRIPTION OF EMBODIMENTS

Embodiment 1

Figure 2:
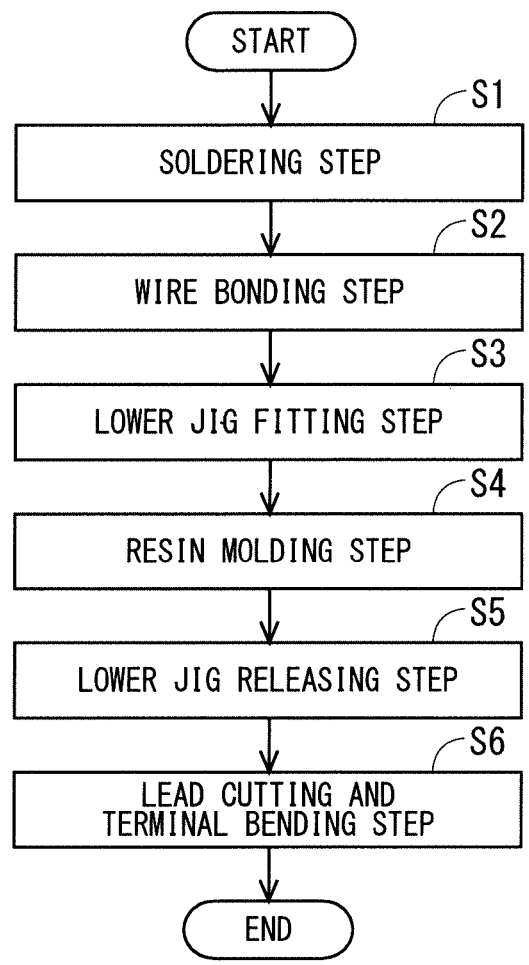
FIG. 2 is a flow chart showing a method for manufacturing the semiconductor device according to Embodiment 1.

Embodiment 1 will be described below with reference to the drawings. FIG. 1 is a cross-sectional view of a semiconductor device 100 according to Embodiment 1.

As illustrated in FIG. 1, the semiconductor device 100 is of a transfer molding type, and includes a base plate 1, an insulating sheet 3, a heat spreader 4, a frame 5, two semiconductor elements 6, and a molding resin 8.

The base plate 1 is an aluminum plate rectangular in plan view, and has a plurality of pin fins 2 for heat dissipation protruding downward from a lower surface of the base plate 1. The plurality of pin fins 2 are made of aluminum, and are formed integrally with the base plate 1.

The heat spreader 4 is disposed over an upper surface of the base plate 1 through the insulating sheet 3. The two semiconductor elements 6 are mounted over an upper surface of the heat spreader 4 through solders 6a. The number of semiconductor elements 6 is not limited to two, and may be one or three or more.

The frame 5 is connected to electrodes of the semiconductor elements 6 through solders 6b and a wire 7.

The molding resin 8 is a resin member covering at least side surfaces of the semiconductor elements 6. Specifically, the molding resin 8 includes an epoxy resin, for example, and seals the insulating sheet 3, the heat spreader 4, a portion of the frame 5, and the semiconductor elements 6. The molding resin 8 has a rib 9 covering a side surface of the base plate 1. The rib 9 includes the epoxy resin, and is formed integrally with the molding resin 8. The rib 9 protrudes downward from the entire outer peripheral portion of the molding resin 8 to surround side surfaces of the plurality of pin fins 2. A lower end of the rib 9 is located below lower ends of the plurality of pin fins 2. That is to say, the plurality of pin fins 2 do not protrude from the lower end of the rib 9, and thus a worker is less likely to bring the plurality of pin fins 2 into contact with a workbench by mistake.

Figure 3:
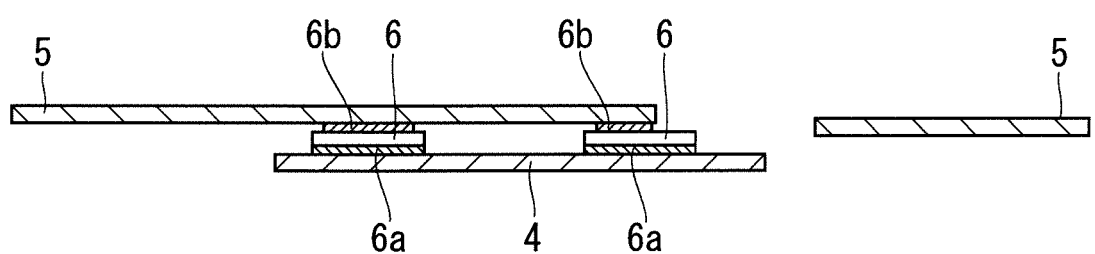
FIG. 3 is a cross-sectional view illustrating a soldering step.
Figure 6:
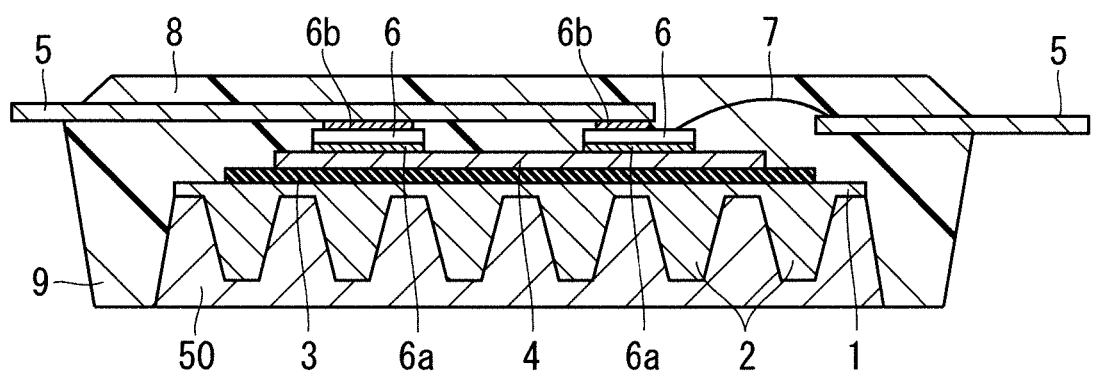
FIG. 6 is a cross-sectional view illustrating a resin molding step.
Figure 7:
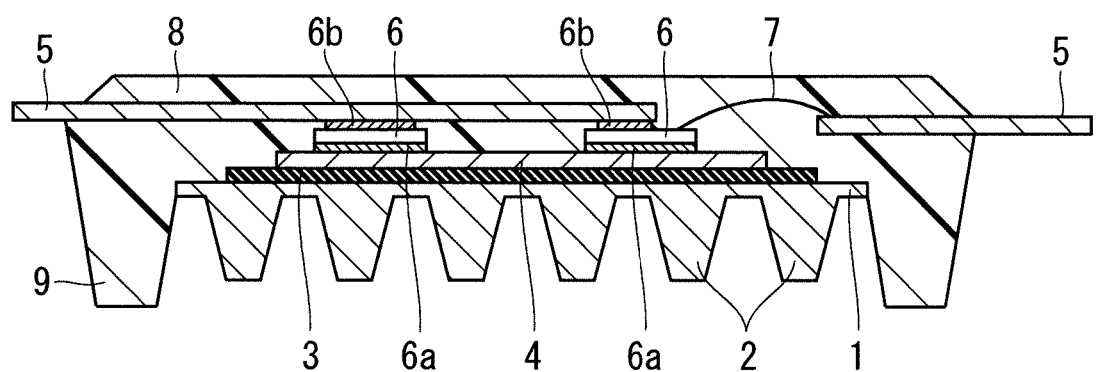
FIG. 7 is a cross-sectional view illustrating a lower jig releasing step.
Figure 8:
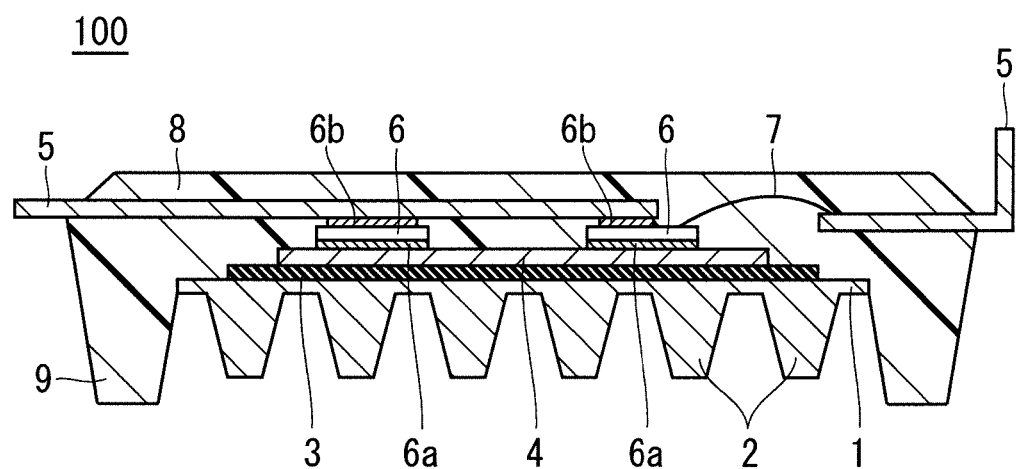
FIG. 8 is a cross-sectional view illustrating a lead cutting and terminal bending step.

A method for manufacturing the semiconductor device 100 will be described next with reference to FIGS. 2 to 8. FIG. 2 is a flow chart showing the method for manufacturing the semiconductor device 100 according to Embodiment 1. FIG. 3 is a cross-sectional view illustrating a soldering step. FIG. 4 is a cross-sectional view illustrating a wire bonding step. FIG. 5 is a cross-sectional view illustrating a lower jig fitting step. FIG. 6 is a cross-sectional view illustrating a resin molding step. FIG. 7 is a cross-sectional view illustrating a lower jig releasing step. FIG. 8 is a cross-sectional view illustrating a lead cutting and terminal bending step.

First, as shown in FIGS. 2 and 3, the semiconductor elements 6 are arranged over the upper surface of the heat spreader 4, and are then soldered to the heat spreader 4 and the frame 5 in the soldering step (step S1).

Next, as shown in FIGS. 2 and 4, the frame 5 and the semiconductor elements 6 are connected by wiring bonding in the wire bonding step (step S2).

Next, as shown in FIGS. 2 and 5, after a lower jig 50 is fit to the plurality of pin fins 2 in a molding die, the heat spreader 4 is mounted over the upper surface of the base plate 1 through the insulating sheet 3 to form an assembly in the lower jig fitting step (step S3). A lower surface of the lower jig 50 is a flat surface, and a bottom surface of the assembly is flat in a state of the lower jig 50 being fit to the plurality of pin fins 2.

Next, as shown in FIGS. 2 and 6, the assembly is molded, and is molded for sealing by the epoxy resin in the resin molding step (step S4).

Next, as shown in FIGS. 2 and 7, the lower jig 50 is removed from the molded assembly in the lower jig releasing step (step S5).

Next, as shown in FIGS. 2 and 8, the frame 5 is cut and a terminal is bent in the lead cutting and terminal bending step (step S6).

Herein, the soldering step corresponds to (a) mounting the semiconductor elements 6 over the upper surface of the heat spreader 4. The lower jig fitting step corresponds to (b) after fitting the lower jig 50 to the plurality of pin fins 2 in the molding die, mounting the heat spreader 4 over the upper surface of the base plate 1 through the insulating sheet 3 to form the assembly. The resin molding step corresponds to (c) molding the assembly. Furthermore, the lower jig releasing step corresponds to (d) removing the lower jig 50 from the molded assembly.

As described above, the semiconductor device 100 according to Embodiment 1 includes: the base plate 1 having the plurality of pin fins 2 on the lower surface thereof; the semiconductor elements 6 mounted on an upper side of the base plate 1; and the resin member covering at least the side surfaces of the semiconductor elements 6, wherein the resin member has the rib 9 covering the side surface of the base plate 1, and the lower end of the rib 9 is located below the lower ends of the plurality of pin fins 2. The resin member is herein the molding resin 8 further sealing the semiconductor elements 6.

Since the plurality of pin fins 2 do not protrude downward from the rib 9, contact deformation of the pin fins 2 can be suppressed during assembly of the semiconductor device 100 and the like.

The method for manufacturing the semiconductor device 100 includes: (a) mounting the semiconductor elements 6 over the upper surface of the heat spreader 4; (b) after fitting the lower jig 50 to the plurality of pin fins 2 in the molding die, mounting the heat spreader 4 over the upper surface of the base plate 1 through the insulating sheet 3 to form the assembly; (c) molding the assembly; and (d) removing the lower jig 50 from the molded assembly.

Since the bottom surface of the assembly is flat during molding, pressure is uniformly applied to a plane of the insulating sheet 3 during molding, and a curing reaction evenly proceeds, so that the quality can be improved and an insulation fault can be suppressed in the semiconductor device 100.

The lower jig 50 may herein be provided to the molding die. That is to say, the lower jig 50 may be a portion of the molding die. In this case, the number of parts of the assembly can be reduced to improve ease of assembly of the assembly.

Modifications of Embodiment 1

Figure 9:
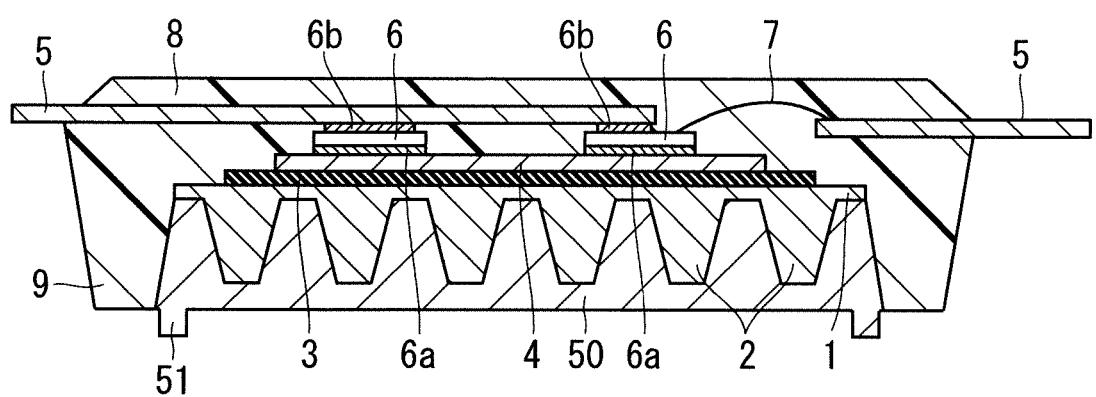
FIG. 9 is a cross-sectional view illustrating the resin molding step according to Modification 1 of Embodiment 1.
Figure 11:
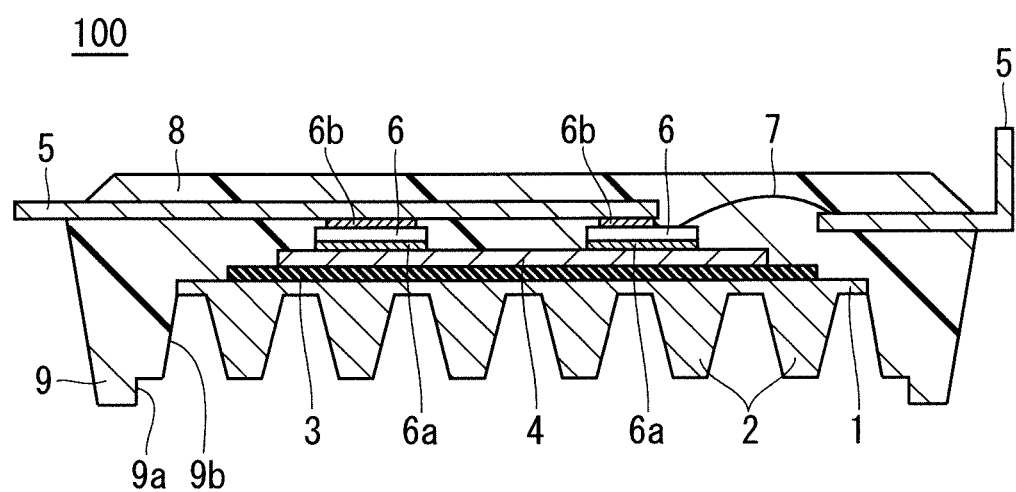
FIG. 11 is a cross-sectional view illustrating the lead cutting and terminal bending step according to Modification 3 of Embodiment 1.

Modifications of Embodiment 1 will be described next. FIG. 9 is a cross-sectional view illustrating the resin molding step according to Modification 1 of Embodiment 1. FIG. 10 is a cross-sectional view illustrating the resin molding step according to Modification 2 of Embodiment 1. FIG. 11 is a cross-sectional view illustrating the lead cutting and terminal bending step according to Modification 3 of Embodiment 1.

As illustrated in FIG. 9, the lower jig 50 may have a protrusion 51 protruding downward from the lower surface thereof. The protrusion 51 is formed on the entire outer peripheral portion of the lower surface of lower jig 50. The worker can thus easily remove the lower jig 50 from the molded assembly by holding the protrusion 51 in the lower jig releasing step.

As illustrated in FIG. 10, a recess 9a may be formed in a portion at a lower end portion of the rib 9 opposing the lower jig 50 in the resin molding step. The recess 9a is formed in the entire peripheral portion of the rib 9. When the lower jig is pulled at an angle by mistake during release of the lower jig 50, a lateral force is applied to a portion of the semiconductor device 100 to which the lower jig 50 is fit, so that the portion at the lower end portion of the rib 9 made of resin opposing the lower jig 50 can be cracked. When the recess 9a is formed in the portion at the lower end portion of the rib 9 opposing the lower jig 50, cracking of the resin in the portion can be suppressed due to the absence of the resin in the portion.

As illustrated in FIG. 11, a portion of the rib 9 being in contact with the lower jig 50 may have a mirror surface 9b. Specifically, the method for manufacturing the semiconductor device 100 may include a step of mirror finishing the portion of the rib 9 being in contact with the lower jig 50 between the resin molding step and the lower jig releasing step. Releasability of the lower jig 50 from the molded assembly can thereby be improved.

Embodiment 2

Figure 12:
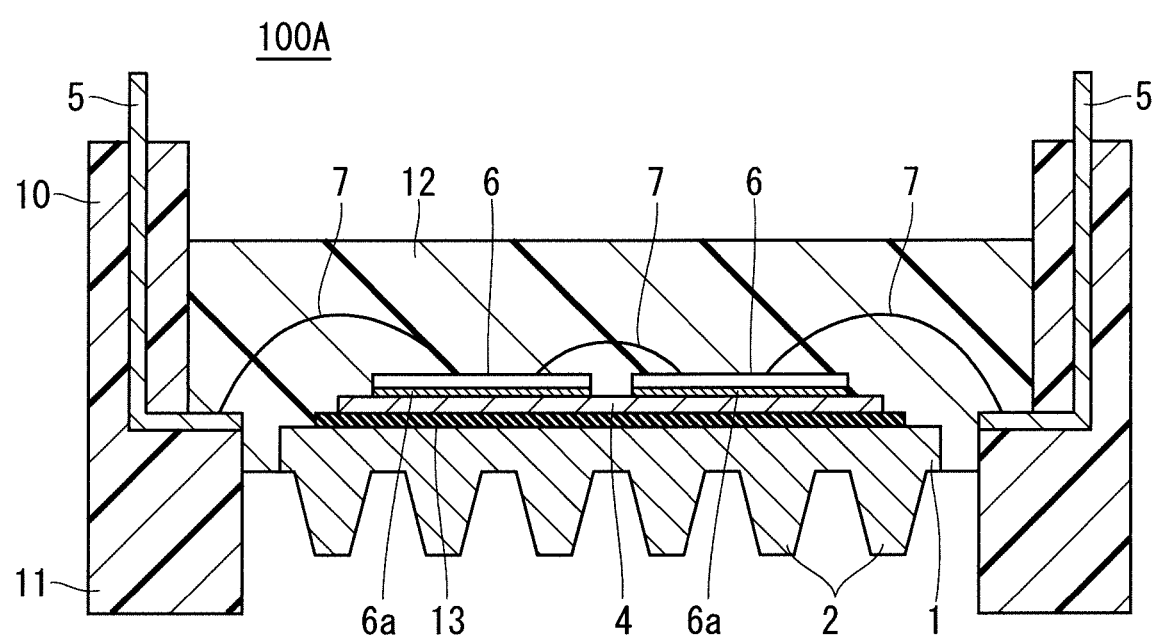
FIG. 12 is a cross-sectional view of a semiconductor device according to Embodiment 2.

A semiconductor device 100A according to Embodiment 2 will be described next. FIG. 12 is a cross-sectional view of the semiconductor device 100A according to Embodiment 2. In Embodiment 2, the same components as those described in Embodiment 1 bear the same reference signs as those in Embodiment 1.

As illustrated in FIG. 12, in Embodiment 2, the resin member covering at least the side surfaces of the semiconductor elements 6 is a resin case 10, and the semiconductor device 100A further includes a sealing resin 12 disposed within the resin case 10 and sealing the semiconductor elements 6. The sealing resin 12 includes a silicone gel. The semiconductor device 100A includes a ceramic plate 13 in place of the insulating sheet 3. The semiconductor device 100A including the resin case 10 is hereinafter also referred to as the semiconductor device 100A of a case type.

The resin case 10 includes an epoxy resin, for example, and has a rib 11 covering the side surface of the base plate 1. The rib 11 includes the epoxy resin, and is formed integrally with the resin case 10. The rib 11 protrudes downward from the entire outer peripheral portion of the resin case 10 to surround the side surfaces of the plurality of pin fins 2. A lower end of the rib 11 is located below the lower ends of the plurality of pin fins 2. That is to say, the plurality of pin fins 2 do not protrude from the lower end of the rib 11, and thus the worker is less likely to bring the plurality of pin fins 2 into contact with the workbench by mistake.

As described above, in the semiconductor device 100A according to Embodiment 2, the resin member is the resin case 10, and the semiconductor device 100A further includes the sealing resin 12 disposed within the resin case 10 and sealing the semiconductor elements 6.

The semiconductor device 100 of the transfer molding type is suitable for a small semiconductor device, and the semiconductor device 100A of the case type is suitable for a large semiconductor device. Thus, even in the large semiconductor device, the plurality of pin fins 2 do not protrude downward from the rib 11, and thus contact deformation of the pin fins 2 can be suppressed during assembly of the semiconductor device 100A and the like.

Embodiment 3

Figure 13:
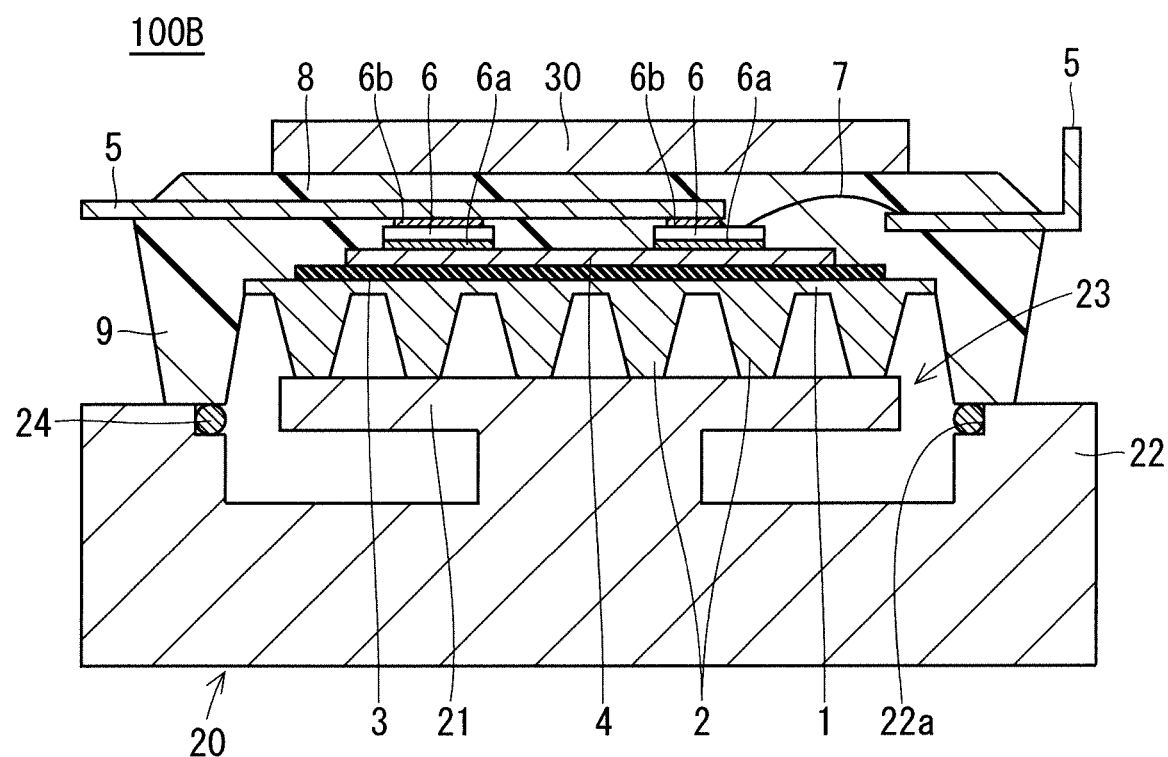
FIG. 13 is a cross-sectional view of a semiconductor device according to Embodiment 3.
Figure 14:
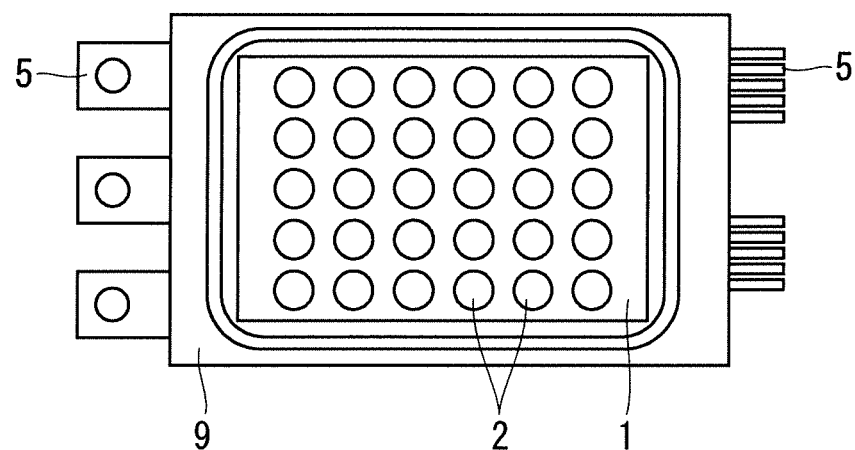
FIG. 14 is a bottom view of the semiconductor device according to Embodiment 3 before assembly of a refrigerant jacket.
Figure 15:
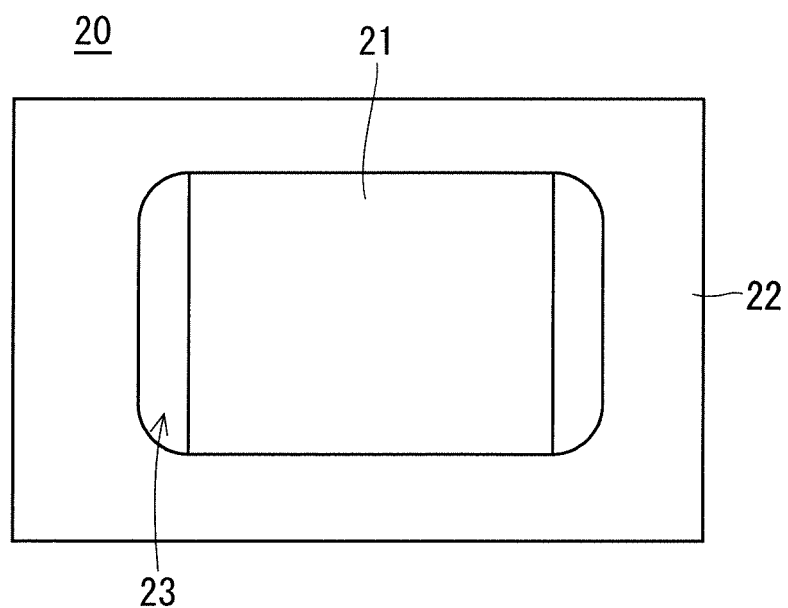
FIG. 15 is a plan view of the refrigerant jacket of the semiconductor device according to Embodiment 3.

A semiconductor device 100B according to Embodiment 3 will be described next. FIG. 13 is a cross-sectional view of the semiconductor device 100B according to Embodiment 3. FIG. 14 is a bottom view of the semiconductor device 100B according to Embodiment 3 before assembly of a refrigerant jacket 20. FIG. 15 is a plan view of the refrigerant jacket 20 of the semiconductor device 100B according to Embodiment 3. In Embodiment 3, the same components as those described in Embodiments 1 and 2 bear the same reference signs as those in Embodiments 1 and 2.

As illustrated in FIGS. 13 to 15, in Embodiment 3, the semiconductor device 100B further includes the refrigerant jacket 20 relative to the semiconductor device 100 according to Embodiment 1. That is to say, the semiconductor device 100B is of the transfer molding type, and includes the base plate 1, the insulating sheet 3, the heat spreader 4, the frame 5, the two semiconductor elements 6, the molding resin 8, and the refrigerant jacket 20.

As illustrated in FIGS. 13 and 15, the refrigerant jacket 20 is rectangular in plan view, is fixed to the lower end of the rib 9 and the lower ends of the plurality of pin fins 2, and defines a flow path 23 for cooling water as a refrigerant formed between the base plate 1 and the refrigerant jacket 20. The refrigerant jacket 20 includes a middle plate 21 being T-shaped in cross-section and a body 22 being recessed in cross-section. The middle plate 21 is formed in a recessed portion of the body 22, and the body 22 is formed in an outer peripheral portion of the refrigerant jacket 20, that is, outward of the middle plate 21. An upper surface of the middle plate 21 is located above the body 22 and is thus in contact with the lower ends of the plurality of pin fins 2, and an upper surface of the body 22 is in contact with the lower end of the rib 9.

The body 22 has, in the entire inner peripheral portion of the upper surface thereof, a groove 22a in which an O-ring 24 is housed. The O-ring 24 in the form of a rectangular frame is housed in the groove 22a. A pressing plate 30 pressing the molding resin 8 and the base plate 1 downward against the refrigerant jacket 20 is disposed on an upper surface of the molding resin 8.

As described above, the semiconductor device 100B according to Embodiment 3 further includes the refrigerant jacket 20 fixed to the lower end of the rib 9 and the lower ends of the plurality of pin fins 2, and defining the flow path 23 for the cooling water formed between the base plate 1 and the refrigerant jacket 20, wherein the refrigerant jacket 20 includes the middle plate 21 being in contact with the lower ends of the pin fins 2 and the body 22 located outward of the middle plate 21 and being in contact with the lower end of the rib 9, and the upper surface of the middle plate 21 is located above the body 22.

The rib 9 protruding downward beyond the pin fins 2 can increase the distance between the frame 5 extending outward from a side surface of the molding resin 8 and the refrigerant jacket 20, and thus a creepage distance and a spatial distance required for insulation between the frame 5 and the refrigerant jacket 20 can be secured.

The lower ends of the plurality of pin fins 2 and the middle plate 21 are in contact with each other to bring the base plate 1 and the middle plate 21 close to each other, so that the flow velocity of the cooling water flowing between the base plate 1 and the middle plate 21 increases to improve heat dissipation of the semiconductor device 100B.

Embodiment 4

A semiconductor device according to Embodiment 4 will be described next. FIG. 16 is a cross-sectional view of the semiconductor device according to Embodiment 4 before assembly of the refrigerant jacket 20. In Embodiment 4, the same components as those described in Embodiments 1 to 3 bear the same reference signs as those in Embodiments 1 to 3.

As illustrated in FIG. 16, in Embodiment 4, a resin coating 25 is formed on an inner peripheral surface of the rib 9 and at a boundary between the base plate 1 and the molding resin 8 as the resin member.

A resin such as the molding resin 8 is a hygroscopic material, so that, by forming the resin coating 25 on the inner peripheral surface of the rib 9 and at the boundary between the base plate 1 and the molding resin 8 to be in contact with the cooling water in the semiconductor device according to Embodiment 4, absorption of moisture in the portions can be suppressed.

As described above, in the semiconductor device according to Embodiment 4, the resin coating 25 is formed on the inner peripheral surface of the rib 9 and at the boundary between the base plate 1 and the molding resin 8, so that absorption of moisture in the portions can be suppressed, and, by blocking ingress of the cooling water into the molding resin 8, the insulation fault of the semiconductor device can be suppressed.

Embodiment 5

A semiconductor device 100C according to Embodiment 5 will be described next. FIG. 17 is a cross-sectional view of the semiconductor device 100C according to Embodiment 5 before assembly of the refrigerant jacket 20. FIG. 18 is a cross-sectional view of the semiconductor device 100C according to Embodiment 5. In Embodiment 5, the same components as those described in Embodiments 1 to 4 bear the same reference signs as those in Embodiments 1 to 4.

While the refrigerant jacket 20 has the groove 22a in which the O-ring 24 is housed in Embodiment 3, the rib 9 has, at the lower end portion thereof, a groove 9c in which the O-ring 24 is housed in Embodiment 5 as illustrated in FIGS. 17 and 18. The rib 9 has the groove 9c in the entire peripheral portion of the lower end portion thereof, and the O-ring 24 in the form of the rectangular frame is housed in the groove 9c.

As described above, the rib 9 has, at the lower end portion thereof, the groove 9c in which the O-ring 24 is housed in the semiconductor device 100C according to Embodiment 5. The groove 9c can be formed in the resin molding step, so that a man-hour relating to grooving can be reduced compared with a case where the groove 22a is formed in the refrigerant jacket 20. Similarly, since the groove 22a is not required to be formed in the refrigerant jacket 20, a man-hour relating to metal working when the refrigerant jacket 20 is manufactured can be reduced.

Other Modifications

A case where the semiconductor device of the transfer molding type includes the refrigerant jacket 20 has been described in Embodiments 3 to 5, but the semiconductor device is not limited to the semiconductor device of the transfer molding type, and the semiconductor device of the case type may include the refrigerant jacket 20. Similar effects to those obtained in Embodiments 3 to 5 can be obtained in this case.

While the present disclosure has been described in detail, the foregoing description is in all aspects illustrative and not restrictive. It is understood that numerous unillustrated modifications can be devised without departing from the scope of the present disclosure.

Embodiments can freely be combined with each other, and can be modified or omitted as appropriate.

EXPLANATION OF REFERENCE SIGNS 1 base plate, 2 pin fin, 3 insulating sheet, 4 heat spreader, 6 semiconductor element, 8 molding resin, 9 rib, 9a recess, 9c groove, 10 resin case, 12 sealing resin, 20 refrigerant jacket, 21 middle plate, 22 body, 24 O-ring, 25 resin coating, 50 lower jig, 51 protrusion, 100, 100A, 100B, 100C semiconductor device.

The invention claimed is:

1. A semiconductor device comprising:
   a base plate having a plurality of pin fins on a lower surface thereof;
   a semiconductor element mounted on an upper side of the base plate; and
   a resin member covering at least a side surface of the semiconductor element, wherein
   the resin member has a rib covering a side surface of the base plate,
   a lower end of the rib is located below lower ends of the plurality of pin fins,
   the resin member is a molding resin that seals the semiconductor element, and
   the resin member and the rib are a single piece.

2. The semiconductor device according to claim 1 further comprising
   a refrigerant jacket fixed to the lower end of the rib and the lower ends of the plurality of pin fins, and defining a refrigerant flow path formed between the base plate and the refrigerant jacket, wherein
   the refrigerant jacket includes a middle plate being in contact with the lower ends of the pin fins and a body located outward of the middle plate and being in contact with the lower end of the rib, and
   an upper surface of the middle plate is located above the body.

3. The semiconductor device according to claim 2, wherein
   a resin coating is located on an inner peripheral surface of the rib and at a boundary between the base plate and the resin member.

4. The semiconductor device according to claim 2, wherein
   the rib has, at a lower end portion thereof, a groove in which an O-ring is housed.

5. A semiconductor device manufacturing method for manufacturing the semiconductor device according to claim 1, the semiconductor device manufacturing method comprising:
   (a) mounting the semiconductor element over an upper surface of a heat spreader;
   (b) after fitting a lower jig to the plurality of pin fins in a molding die, mounting the heat spreader over an upper surface of the base plate through an insulating sheet to form an assembly;
   (c) molding the assembly; and
   (d) removing the lower jig from the molded assembly.

6. The semiconductor device manufacturing method according to claim 5, wherein
   the lower jig is provided to the molding die.

7. The semiconductor device manufacturing method according to claim 5, wherein
   the lower jig has a protrusion protruding downward from a lower surface thereof.

8. The semiconductor device manufacturing method according to claim 5, wherein
in step (c), a recess is formed in a portion at a lower end portion of the rib opposing the lower jig.

9. The semiconductor device manufacturing method according to claim 5, further comprising
(e) mirror finishing a portion of the rib being in contact with the lower jig between step (c) and step (d).

10. A semiconductor device comprising:
a base plate having a plurality of pin fins on a lower surface thereof;
a semiconductor element mounted on an upper side of the base plate;
a resin member covering at least a side surface of the semiconductor element, wherein
the resin member has a rib covering a side surface of the base plate,
a lower end of the rib is located below lower ends of the plurality of pin fins
the resin member is a resin case,
the semiconductor device further comprises a sealing resin disposed within the resin case and sealing the semiconductor element, and
the sealing resin is positioned between the base plate and the resin case such that the sealing resin spaces the base plate from the resin case.

11. A semiconductor device comprising:
a base plate having a plurality of pin fins on a lower surface thereof;
a semiconductor element mounted on an upper side of the base plate;
a resin member covering at least a side surface of the semiconductor element; and
a refrigerant jacket defining a refrigerant flow path formed between the base plate and the refrigerant jacket, wherein
the resin member has a rib covering a side surface of the base plate,
a lower end of the rib is located below lower ends of the plurality of pin fins,
the refrigerant jacket is fixed to the lower end of the rib and the lower ends of the plurality of pin fins,
the refrigerant jacket includes a middle plate being in contact with the lower ends of the pin fins and a body located outward of the middle plate and being in contact with the lower end of the rib, and
an upper surface of the middle plate is located above the body.

12. The semiconductor device according to claim 11, wherein
a resin coating is located on an inner peripheral surface of the rib and at a boundary between the base plate and the resin member.

13. The semiconductor device according to claim 11, wherein
the rib has, at a lower end portion thereof, a groove in which an O-ring is housed.

14. A semiconductor device manufacturing method for manufacturing a semiconductor device comprising: a base plate having a plurality of pin fins on a lower surface thereof; a semiconductor element mounted on an upper side of the base plate; and a resin member covering at least a side surface of the semiconductor element, wherein the resin member has a rib covering a side surface of the base plate, a lower end of the rib is located below lower ends of the plurality of pin fins, and the resin member is a molding resin further sealing the semiconductor element,
the semiconductor device manufacturing method comprising:
(a) mounting the semiconductor element over an upper surface of a heat spreader;
(b) after fitting a lower jig to the plurality of pin fins in a molding die, mounting the heat spreader over an upper surface of the base plate through an insulating sheet to form an assembly;
(c) molding the assembly; and
(d) removing the lower jig from the molded assembly.

15. The semiconductor device manufacturing method according to claim 14, wherein
the lower jig is provided to the molding die.

16. The semiconductor device manufacturing method according to claim 14, wherein
the lower jig has a protrusion protruding downward from a lower surface thereof.

17. The semiconductor device manufacturing method according to claim 14, wherein
in step (c), a recess is formed in a portion at a lower end portion of the rib opposing the lower jig.

18. The semiconductor device manufacturing method according to claim 14, further comprising
(e) mirror finishing a portion of the rib being in contact with the lower jig between step (c) and step (d).

* * * * *